United States Patent
Sato

(10) Patent No.: US 9,595,321 B1
(45) Date of Patent: Mar. 14, 2017

(54) MULTI-LEVEL REVERSIBLE RESISTANCE-SWITCHING MEMORY

(71) Applicant: SanDisk 3D LLC, Milpitas, CA (US)

(72) Inventor: Yoshihiro Sato, Nagoya (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/049,088

(22) Filed: Feb. 21, 2016

(51) Int. Cl.
| | | |
|---|---|---|
| G11C 11/00 | (2006.01) | |
| G11C 11/56 | (2006.01) | |
| G11C 13/00 | (2006.01) | |
| H01L 45/00 | (2006.01) | |
| H01L 27/24 | (2006.01) | |

(52) U.S. Cl.
 CPC ...... *G11C 11/5685* (2013.01); *G11C 13/0007* (2013.01); *G11C 13/0069* (2013.01); *H01L 27/2481* (2013.01); *H01L 45/08* (2013.01); *H01L 45/1233* (2013.01); *H01L 45/146* (2013.01); *H01L 45/147* (2013.01); *G11C 2013/0092* (2013.01); *G11C 2213/31* (2013.01); *G11C 2213/32* (2013.01); *G11C 2213/71* (2013.01)

(58) Field of Classification Search
 CPC .. G11C 11/00; G11C 11/5685; G11C 13/0069
 USPC ............ 365/46, 94, 100, 129, 148, 158, 163
 See application file for complete search history.

(56) References Cited

U.S. PATENT DOCUMENTS 8,879,299 B2 * 11/2014 Hou .................. G11C 13/0007
365/115
2013/0094278 A1 * 4/2013 Hou .................. G11C 13/0007
365/148

OTHER PUBLICATIONS

Sato et al., "Sub-100-μA Reset Current of Nickel Oxide Resistive Memory Through Control of Filamentary Conductance by Current Limit of MOSFET", IEEE Transactions on Electron Devices, vol. 55, No. 5, May 2008, 7 pages.
Bai et al., "Study of Multi-level Characteristics for 3D Vertical Resistive Switching Memory", Scientific Reports, Apr. 10, 2014, 7 pages.

* cited by examiner

Primary Examiner — Harry W Byrne
(74) Attorney, Agent, or Firm — Vierra Magen Marcus LLP

(57) ABSTRACT

A method is provided for operating a reversible resistance-switching memory cell. The method includes programming the reversible resistance-switching memory cell to three or more memory states while limiting the current through the memory cell to less than between about 0.1 microamp and about 30 microamps.

8 Claims, 16 Drawing Sheets

| | Vpgm | Icomp | Vg | Ifwd | Irev |
|---|---|---|---|---|---|
| State 1 | +4V | +1μA | 0.8V | +100nA | -10nA |
| State 2 | +4V | +10μA | 1.2V | +1μA | -10nA |
| State 3 | -4V | -1μA | 0.8V | +10nA | -100nA |
| State 4 | -4V | -10μA | 1.2V | +10nA | -1μA |
| State 5 | +/-2.5V | +/-10μA | 1.2V | +10nA | -10nA |

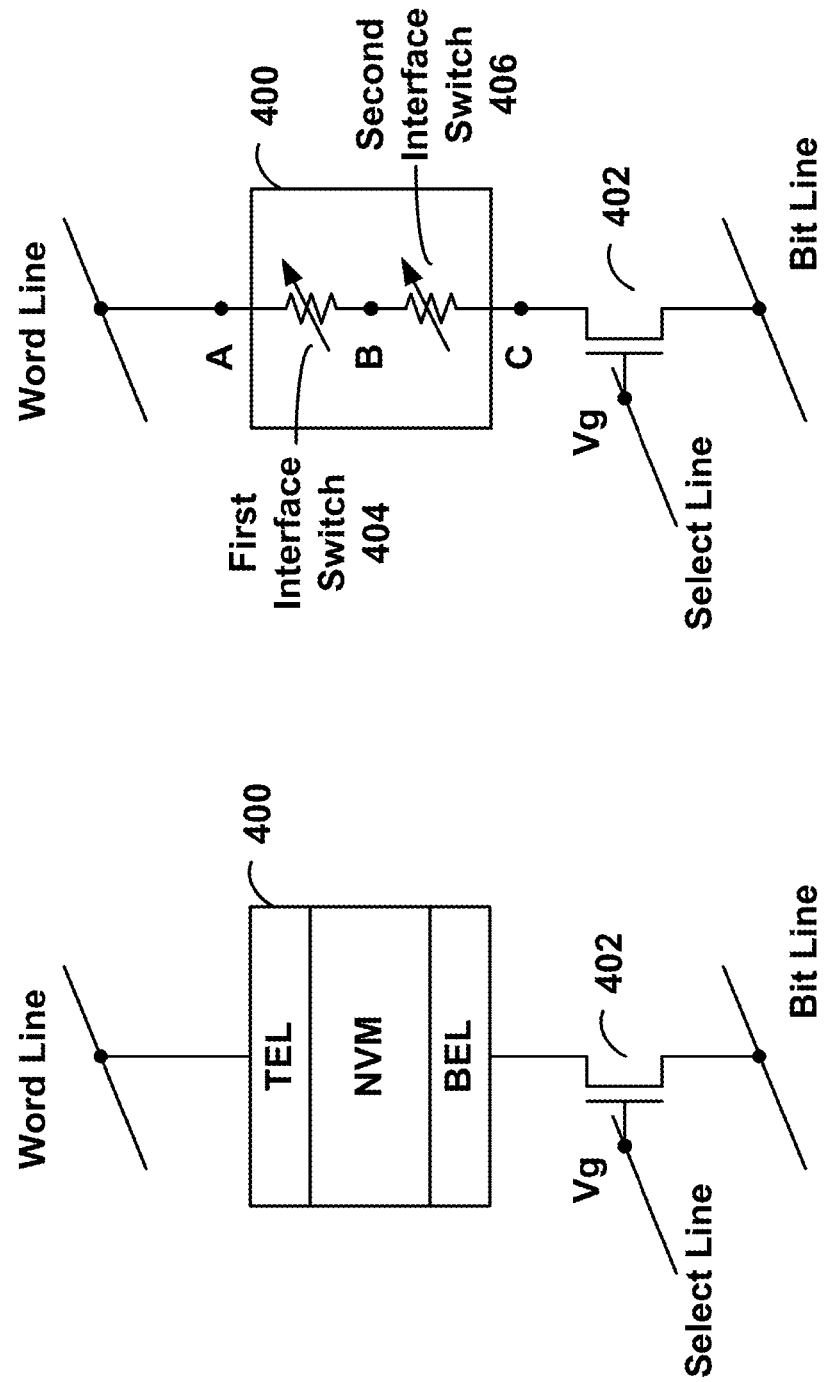

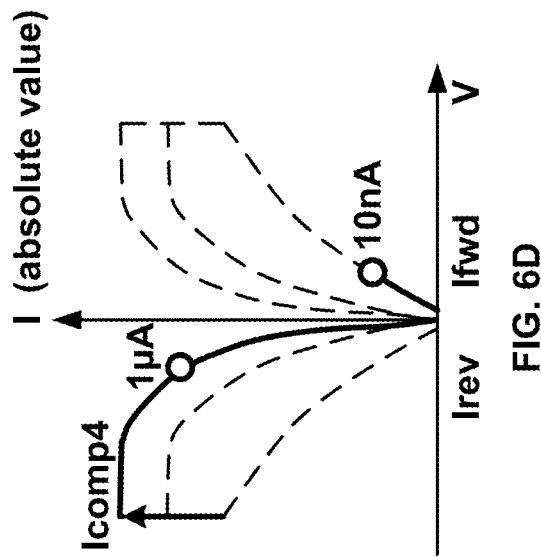
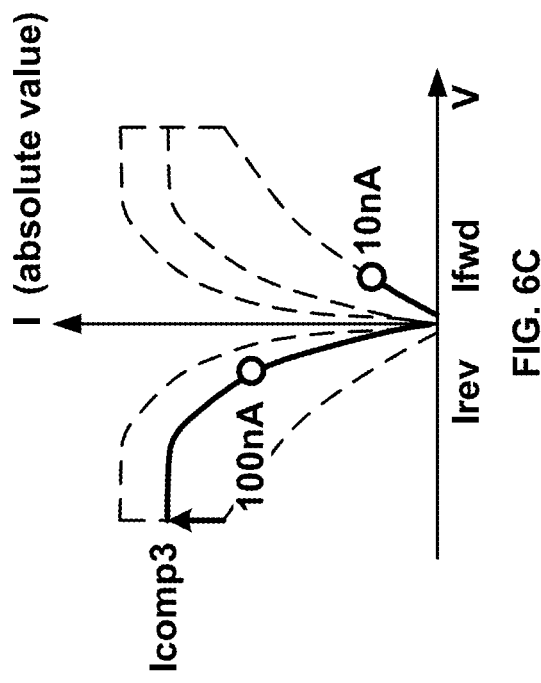

|  | Forward Read | | | Reverse Read | | |
|---|---|---|---|---|---|---|
|  | +100nA | +1µA | 10nA | -100nA | -1µA | -10nA |
| State 1 | ✓ |  |  |  |  |  |
| State 2 |  | ✓ |  |  |  | ✓ |
| State 3 |  |  | ✓ |  |  | ✓ |
| State 4 |  |  | ✓ |  | ✓ |  |
| State 5 |  |  | ✓ | ✓ |  | ✓ |

FIG. 7

|        | Vpgm    | Icomp    | Vg   | Ifwd    | Irev    |
|--------|---------|----------|------|---------|---------|
| State 1 | +4V    | +1µA     | 0.8V | +100nA  | -10nA   |
| State 2 | +4V    | +10µA    | 1.2V | +1µA    | -10nA   |
| State 3 | -4V    | -1µA     | 0.8V | +10nA   | -100nA  |
| State 4 | -4V    | -10µA    | 1.2V | +10nA   | -1µA    |
| State 5 | +/-2.5V | +/-10µA | 1.2V | +10nA   | -10nA   |

FIG. 10

MULTI-LEVEL REVERSIBLE RESISTANCE-SWITCHING MEMORY

BACKGROUND

The present disclosure relates to technology for non-volatile storage.

One example of non-volatile memory uses resistance-switching memory elements. A variety of materials exhibit reversible resistance-switching behavior. These materials include chalcogenides, carbon polymers, perovskites, and certain metal oxides and nitrides. Specifically, there are metal oxides and nitrides which include only one metal and exhibit reliable resistance switching behavior. This group includes, for example, NiO, $Nb_2O_5$, $TiO_2$, $HfO_2$, $Al_2O_3$, $MgO_x$, $CrO_2$, VO, BN, and AlN.

A layer of one of these materials may be formed in an initial state, for example a relatively low-resistance state. Upon application of sufficient current or voltage, the material switches to a stable high-resistance state. This resistance switching is reversible such that subsequent application of an appropriate current or voltage can serve to return the resistance-switching material to a stable low-resistance state. This conversion can be repeated many times. For some materials, the initial state is high-resistance rather than low-resistance.

A rewriteable non-volatile memory cell may be formed that includes a diode coupled in series with a reversible resistance-switching material such as a metal oxide or metal nitride. However, operating memory devices that employ reversible resistance-switching materials is difficult. Furthermore, operating memory devices that employ reversible resistance-switching materials to store multiple bits of data is difficult.

Some devices employ reversible resistance-switching material that is used to store two ranges of resistance and, therefore, the memory cell can be programmed/erased between two states, an erased state and a programmed state that correspond to data "1" and data "0." Such a device is referred to as a binary or two-state device.

A multi-level memory cell is implemented by identifying multiple, distinct allowed ranges of resistance (or other property). Each distinct range corresponds to a predetermined value for the set of data bits. The specific relationship between the data programmed into the memory cell and range of resistance depends upon the data encoding scheme adopted for the memory cells.

BRIEF DESCRIPTION OF THE DRAWINGS

FIG. 4A is a diagram of a reversible resistance-switching memory cell.

FIG. 4B is a circuit diagram of the reversible resistance-switching memory cell of FIG. 4A.

FIGS. 6A-6E illustrate diagrams showing example bipolar read currents for a reversible resistance-switching memory cell having five different memory states.

FIG. 7 is diagram summarizing forward read and reverse read currents for each of the five memory states depicted in FIGS. 6A-6E.

FIGS. 8A and 8B illustrate block diagrams of example circuits that may be used to perform bipolar reads.

FIG. 10 illustrates example programming parameters for programming a reversible resistance-switching memory cell.

DETAILED DESCRIPTION

Figure 1:
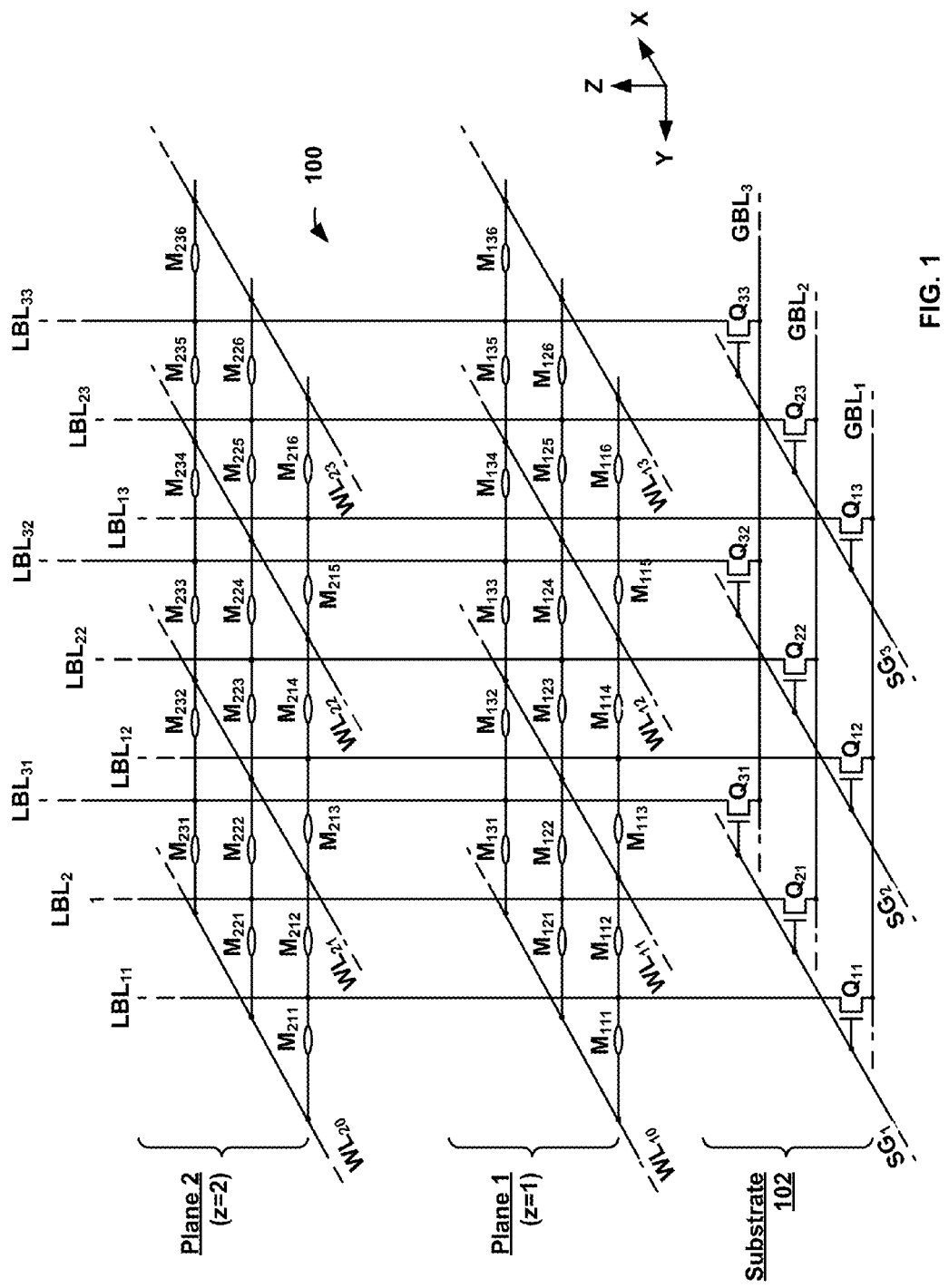
FIG. 1 is an equivalent circuit of a portion of an example three-dimensional array of reversible resistance-switching memory elements, wherein the array has vertical bit lines.

Technology is described for a reversible resistance-switching memory cell that may be programmed into three or more data state for storing two or more data bits. In an embodiment, a reversible resistance-switching memory cell is programmed into any of three or more different memory states while limiting the current through the reversible resistance-switching memory cell. Without wanting to be bound by any particular theory, it is believed that programming the reversible resistance-switching memory cell while limiting the current through the reversible resistance-switching memory cell may cause the reversible resistance-switching memory cell to operate in an interfacial switching mode of operation.

A cross-point memory array includes memory elements (also referred to herein as "memory cells") that are placed at the intersections of a first set of control lines (e.g., word lines) arranged in a first direction and a second set of control lines (e.g., bit lines) arranged in a second direction perpendicular to the first direction. A three-dimensional cross-point memory array includes vertical bit lines or bit lines that are arranged orthogonal to a semiconductor substrate.

The memory cells used in a three-dimensional cross-point memory array may be state-change memory cells, such as reversible resistance-switching memory cells, phase change memory cells, or other types of memory cells. For some state-change memory cells, the resistance (and thus inversely the conductance) of the individual memory cells is changed as a result of a voltage placed across the orthogonally intersecting conductors to which the memory cell is connected. Depending on the type of state-change memory cell, the state may change in response to a voltage across it, a level of current though it, an amount of electric field across it, a level of heat applied to it, and the like.

With some state-change memory cell material, the amount of time that the voltage, current, electric field, heat and the like is applied to the memory element determines when its conductive state changes and the direction in which the change takes place. In between such state changing operations, the resistance of the memory cell remains unchanged, so is non-volatile. The three-dimensional cross-point memory array architecture described herein may be implemented with a memory cell material selected from a wide variety of such materials having different properties and operating characteristics.

The resistance of the memory cell, and thus its detectable storage state, can be repetitively set from an initial level to another level and then re-set back to the initial level. Upon application of sufficient voltage, current, or other stimulus, the reversible resistance-switching material switches to a stable low-resistance state, which is sometimes referred to as SETTING the device. This resistance-switching is reversible such that subsequent application of an appropriate voltage, current, or other stimulus can return the reversible resistance-switching material to a stable high-resistance state, which is sometimes referred to as RESETTING the device. This conversion can be repeated many times. The low resistance state is sometimes referred to as an "ON" state. The high resistance state is sometimes referred to as an "OFF" state. For some switching materials, the initial state is low-resistance rather than high-resistance.

For some materials, the amount or duration of the voltage, current, electric field, heat and the like applied to change its state in one direction is different (asymmetrical) with that applied to change in another direction. With two detectable states, each memory cell stores one-bit of data. With the use of some materials, more than one bit of data may be stored in each memory cell by designating more than two stable levels of resistance as detectable states of the memory cell. The three-dimensional cross-point memory array architecture herein is quite versatile in the way it may be operated.

In addition, the three-dimensional architecture herein allows variable resistance memory cells to be connected at orthogonal crossings of bit and word line conductors without the need for diodes or other non-linear elements being connected in series with the variable resistive elements. In existing arrays of variable resistance memory cells, a diode is commonly connected in series with each memory cell to reduce the leakage current though the memory cell when it is unselected but nevertheless has a voltage difference placed across it, such as can occur when the unselected memory cell is connected to a bit or word line carrying voltages to selected memory cells connected to those same lines.

Referring to FIG. 1, an architecture of an example embodiment of a three-dimensional (3D) memory array 100 is illustrated in the form of an equivalent circuit of a portion of such a memory. A standard three-dimensional rectangular coordinate system is used for reference, the directions of each of vectors x, y and z being orthogonal with the other two. In an embodiment, the word lines and bit lines of a memory array may cross at an angle equal to or about 90 degrees. In another embodiment, the word lines and bit lines of a memory array may cross at an angle equal to or about 60 degrees.

Memory cells $M_{zxy}$ are formed in a plurality of planes positioned at different distances in the z-direction above the substrate 102. Two planes 1 and 2 are illustrated in FIG. 1, but typically there will be more planes, such as 4, 6, 8, 16, 32, or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines.

Individual memory cells $M_{zxy}$ are connected between one local bit line $LBL_{xy}$ and one word line $WL_{zy}$ adjacent these individual crossings. An individual memory cell $M_{zxy}$ is therefore addressable by placing proper voltages on the local bit line $LBL_{xy}$ and word line $WL_{zy}$ between which the memory cell is connected. The voltages are chosen to provide the electrical stimulus necessary to cause the state of the memory cell to change from an existing state to the desired new state. The levels, duration and other characteristics of these voltages depend upon the material that is used for the memory cells.

Each "plane" of the three-dimensional memory structure is typically formed of at least two layers, one in which the conductive word lines $WL_{zy}$ are positioned and another of a dielectric material that electrically isolates the planes from each other. Additional layers also may be present in each plane, depending for example on the structure of the memory cells $M_{zxy}$. The planes are stacked on top of each other above semiconductor substrate 102 with the local bit lines $LBL_{xy}$ being connected with storage elements $M_{zxy}$ of each plane through which the local bit lines extend.

A circuit for selectively connecting internal memory cells with external data circuits is preferably formed using select devices $Q_{xy}$, where x gives a relative position of the device in the x-direction and y its relative position in the y-direction. The individual select devices $Q_{xy}$ may be a select gate or select transistor, as examples. Global bit lines ($GBL_x$) are elongated in the y-direction and have relative positions in the x-direction that are indicated by the subscript.

Global bit lines ($GBL_x$) are individually connectable with the source or drain of the select devices $Q_{xy}$ having the same position in the x-direction, although during reading and also typically programming only one select device connected with a specific global bit line is turned ON at time. The other of the source or drain of the individual select devices $Q_{xy}$ is connected with one of the local bit lines ($LBL_{xy}$). The local bit lines are elongated vertically, in the z-direction, and form a regular two-dimensional array in the x (row) and y (column) directions.

To connect one set (in this example, designated as one row) of local bit lines with corresponding global bit lines, row select lines $SG_y$ are elongated in the x-direction and connect with control terminals (gates) of a single row of select devices $Q_{xy}$ having a common position in the y-direction. The select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the row select lines $SG_y$ receives a voltage that turns ON the select devices to which it is connected. The remaining row select lines receive voltages that keep their connected select devices $Q_{xy}$ OFF. Because only one select device ($Q_{xy}$) is used with each of the local bit lines ($LBL_{xy}$), the pitch of the array across the semiconductor substrate in both x and y-directions may be made very small, and thus the density of the memory storage elements large.

The memory arrays described herein, including 3D memory array 100, are monolithic three dimensional memory arrays. A monolithic three dimensional memory array is one in which multiple memory levels are formed above (and not in) a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other. The substrates may be thinned or removed from the memory levels before bonding, but as the memory levels are initially formed over separate substrates, such memories are not true monolithic three dimensional memory arrays.

Figure 2:
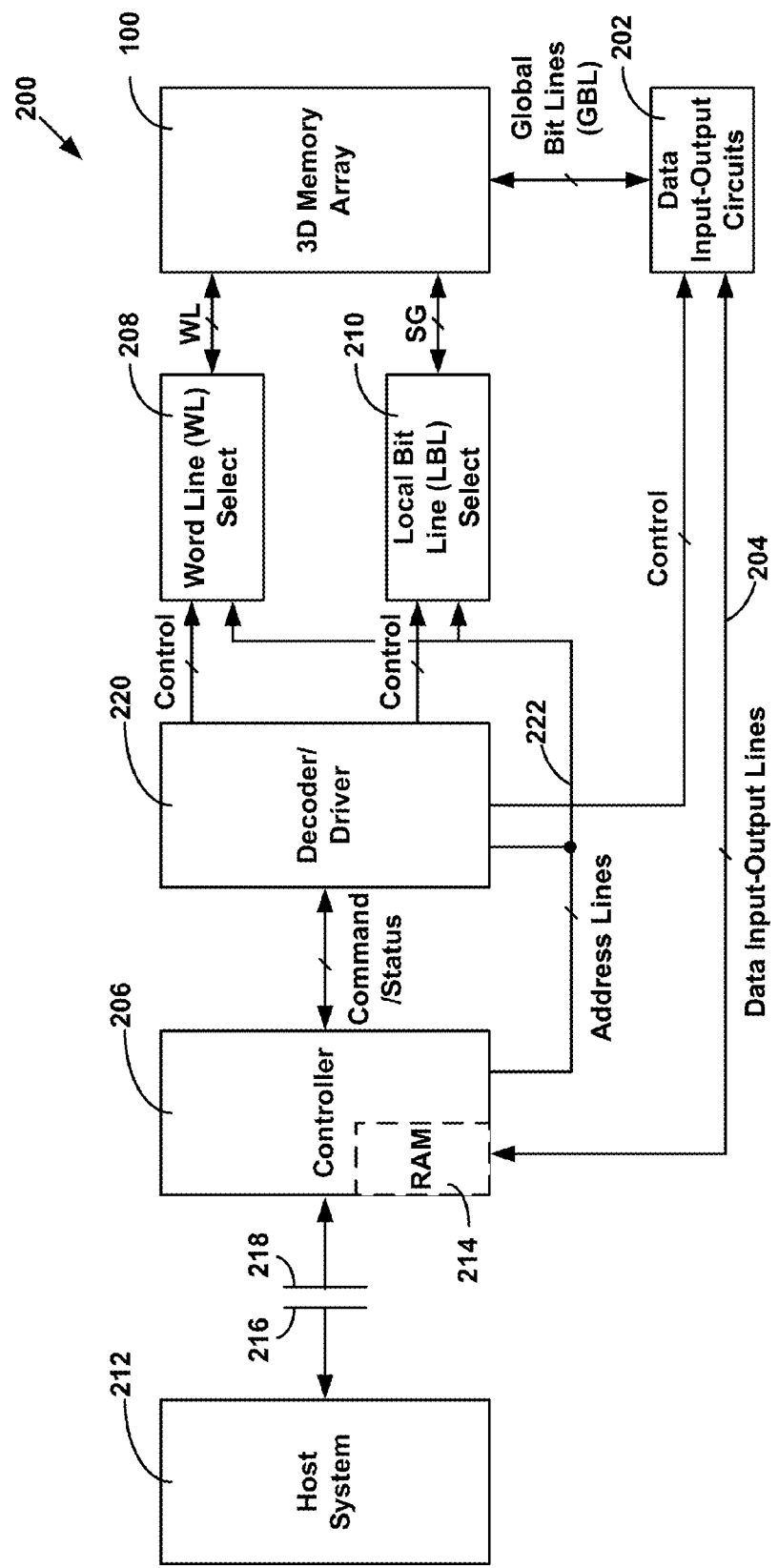
FIG. 2 is a schematic block diagram of a re-programmable non-volatile memory system which utilizes the memory array of FIG. 1, and which indicates connection of the memory system with a host system.

FIG. 2 is a block diagram of an illustrative memory system 200 that can use 3D memory array 100 of FIG. 1. Data input-output circuits 202 are connected to provide (during programming) and receive (during reading) analog electrical quantities in parallel over the global bit-lines $GBL_x$ of FIG. 1 that are representative of data stored in addressed memory cells $M_{zxy}$. Data input-output circuits 202 typically contain sense amplifiers for converting these electrical quantities into digital data values during reading, which digital values are then conveyed over lines 204 to a memory system controller 206. Conversely, data to be programmed into 3D memory array 100 are sent by controller 206 to data input-output circuits 202, which then program that data into addressed memory cells by placing proper voltages on the global bit lines $GBL_x$.

For binary operation, one voltage level is typically placed on a global bit line to represent a binary "1," and another voltage level to represent a binary "0." The memory cells are addressed for reading or programming by voltages placed on the word lines $WL_{zy}$ and row select lines $SG_y$ by respective word line select circuits 208 and local bit line select circuits 210. In the specific three-dimensional array of FIG. 1, the memory cells lying between a selected word line and any of the local bit lines $LBL_{xy}$ connected at one instance through the select devices $Q_{xy}$ to the global bit lines $GBL_x$ may be addressed for programming or reading by appropriate voltages being applied through word line select circuits 208 and local bit line select circuits 210.

Controller 206 typically receives data from and sends data to a host system 212. Controller 206 usually contains an amount of random-access-memory (RAM) 214 for temporarily storing such data and operating information. Commands, status signals and addresses of data being read or programmed are also exchanged between controller 206 and host system 212.

Memory system 200 operates with a wide variety of host systems 212, such as personal computers (PCs), laptop and other portable computers, cellular telephones, personal digital assistants (PDAs), digital still cameras, digital movie cameras and portable audio players. Host system 212 typically includes a built-in receptacle 216 for one or more types of memory cards or flash drives that accepts a mating memory system plug 218 of memory system 200 but some host systems 212 require the use of adapters into which a memory card is plugged, and others require the use of cables therebetween. Alternatively, memory system 200 may be built into host system 212 as an integral part thereof.

Controller 206 conveys to decoder/driver circuits 220 commands received from the host system 212. Similarly, status signals generated by memory system 200 are communicated to controller 206 from decoder/driver circuits 220. Decoder/driver circuits 220 can be simple logic circuits, in the case where controller 206 controls nearly all of the memory operations, or can include a state machine to control at least some of the repetitive memory operations necessary to carry out given commands. Control signals resulting from decoding commands are applied from decoder/driver circuits 220 to word line select circuits 208, local bit line select circuits 210 and data input-output circuits 202.

Also connected to word line select circuits 208 and local bit line select circuits 210 are address lines 222 from controller 206 that carry physical addresses of memory cells to be accessed within 3D memory array 100 to carry out a command from host system 212 The physical addresses correspond to logical addresses received from host system 212, the conversion being made by controller 206 and/or decoder/driver circuits 220.

As a result, local bit line select circuits 210 partially address the designated storage elements within 3D memory array 100 by placing proper voltages on the control elements of the select devices $Q_{xy}$ to connect selected local bit lines ($LBL_{xy}$) with the global bit lines ($GBL_x$). The addressing is completed by word line select circuits 208 applying proper voltages to the word lines $WL_{zy}$ of the array. In one embodiment, any one or combination of controller 206, decoder/driver circuits 220, data input-output circuits 202, word line select circuits 208 and local bit line select circuits 210, or other control logic can be referred to as one or more control circuits.

In some embodiments, one or more managing or control circuits may be used for controlling the operation of a memory array. The one or more managing or control circuits may provide control signals to a memory array to perform a read operation and/or a write operation on the memory array. In one example, the one or more managing or control circuits may include any one of or a combination of control circuitry, state machine, decoders, sense amplifiers, read/write circuits, controllers, and so forth. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Although memory system 200 utilizes 3D memory array 100 of FIG. 1, the system is not limited to use of only that array architecture. A given memory system may alternatively combine this type of memory with other another type including flash memory, such as flash memory having a NAND memory cell array architecture, a magnetic disk drive or some other type of memory. The other type of memory may have its own controller or may in some cases share controller 206 with 3D memory array 100, particularly if there is some compatibility between the two types of memory at an operational level.

Although each of the memory cells $M_{zxy}$ in 3D memory array 100 of FIG. 1 may be individually addressed for changing its state according to incoming data or for reading its existing storage state, in some embodiments it may be preferable to program and read the array in units of multiple memory cells in parallel. In 3D memory array 100 of FIG. 1, one row of memory cells on one plane may be programmed and read in parallel. The number of memory cells operated in parallel depends on the number of memory cells connected to the selected word line.

In some 3D memory arrays 100, the word lines may be segmented (not shown in FIG. 1) so that only a portion of the total number of memory cells connected along their length may be addressed for parallel operation, namely the memory cells connected to a selected one of the segments. In some 3D memory arrays 100 the number of memory cells programmed in one operation may be less than the total number of memory cells connected to the selected word line to minimize IR drops, to minimize power, or for other reasons.

Previously programmed memory cells whose data have become obsolete may be addressed and re-programmed from the states in which they were previously programmed. The states of the memory cells being re-programmed in parallel will therefore most often have different starting states among them. This is acceptable for many memory cell materials but it is usually preferred to re-set a group of memory cells to a common state before they are re-programmed. For this purpose, the memory cells may be grouped into blocks, where the memory cells of each block are simultaneously reset to a common state, preferably one of the programmed states, in preparation for subsequently programming them.

The material used for the non-volatile memory cells $M_{zxy}$ in the array of FIG. 1 can be a chalcogenide, a metal oxide (MeOx), solid electrolytes, phase-change materials, carbon films, carbon nanotubes, or any one of a number of materials that exhibit a stable, reversible shift in resistance in response to an external voltage applied to or current passed through the material. Examples metal oxides include $TiO_x$, $HfO_x$, $ZrO_x$, $WO_x$, $NiO_x$, $CoO_x$, $CoalO_x$, $MnO_x$, $ZnMn_2O_4$, $ZnO_x$, $TaO_x$, $NbO_x$, $HfSiO_x$, $HfAlO_x$. Examples of solid electrolytes include TaO, GeSe or GeS. Example phase-change materials include chalcogenide glasses, often of a composition $Ge_xSb_yTe_z$, where preferably x=2, y=2 and z=5. GeSb has also been found to be useful. Other materials include AgInSbTe, GeTe, GaSb, BaSbTe, InSbTe and various other combinations of these basic elements.

For simplicity the above description has considered the simplest case of storing one data value within each cell: each cell is either reset or set and holds one bit of data. However, the techniques of this technology are not limited to this simple case. By using various values of ON resistance and designing the sense amplifiers to be able to discriminate between several of such values, each memory cell can hold multiple-bits of data in a multiple-level cell (MLC).

Figure 3:
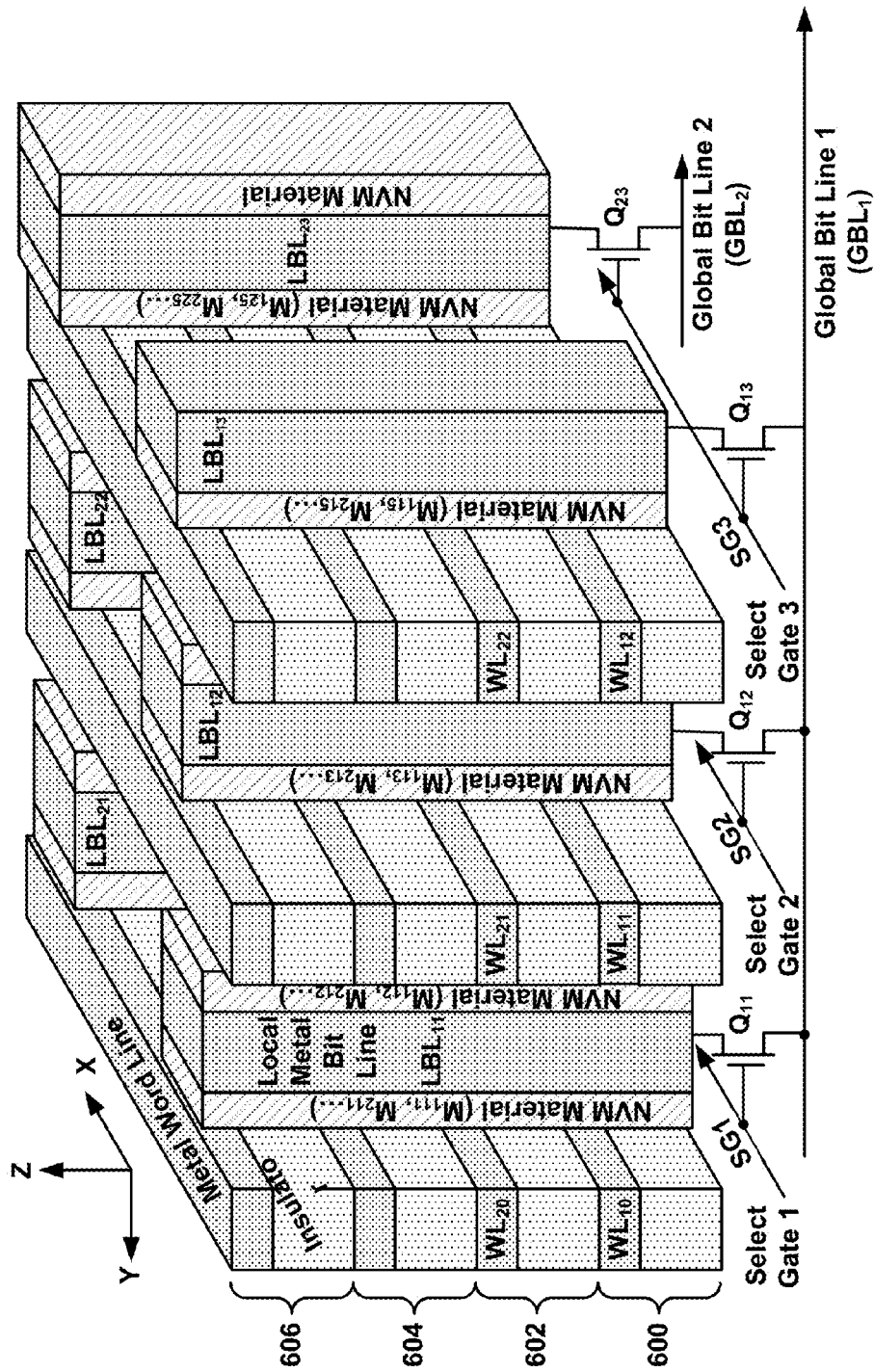
FIG. 3 is an isometric view of a portion of the three-dimensional array shown in FIG. 1 according to a first specific example of an implementation thereof.

One example semiconductor structure for implementing 3D memory array 100 of FIG. 1 is illustrated in FIG. 3, which is configured for use of non-volatile memory (NVM) material that is non-conductive when first deposited. A metal oxide of the type discussed above has this characteristic. Because the material is initially non-conductive, there is no necessity to isolate the memory cells at the cross-points of the word and bit lines from each other.

Several memory cells may be implemented by a single continuous layer of material, which are strips of NVM material oriented vertically along opposite sides of the vertical bit lines in the y-direction and extending upwards through all the planes. A significant advantage of the structure of FIG. 3 is that all word lines and strips of insulation under them in a group of planes may be defined simultaneously by use of a single mask, thus greatly simplifying the manufacturing process.

A small part of four planes 300, 302, 304 and 306 of the three-dimensional array are shown. Elements of the array that correspond to those of the equivalent circuit of FIG. 1 are identified by the same reference numbers. FIG. 3 shows the two planes 1 and 2 of FIG. 1, plus two additional planes on top of them. All of the planes have the same horizontal pattern of conductor, dielectric and NVM material.

In each plane, metal word lines (WL) are elongated in the x-direction and spaced apart in the y-direction. Each plane includes a layer of insulating dielectric that isolates its word lines from the word lines of the plane below it or, in the case of plane 300, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) in the silicon substrate running in the y-direction at the same pitch as the pillar spacing through the select devices ($Q_{xy}$) formed in the substrate whose gates are driven by the row select lines (SG) elongated in the x-direction, which are also formed in the substrate. The select devices $Q_{xy}$ may be conventional CMOS transistors (or vertical MOSFET thin film transistors, or Junction FET, or npn transistors) and fabricated using the same process as used to form the other conventional circuitry.

In the case of using npn transistors instead of MOS transistors, the row select line (SG) lines are replaced with the base contact electrode lines elongated in the x-direction. Also fabricated in the substrate but not shown in FIG. 3 are sense amplifiers, input-output (I/O) circuitry, control circuitry, and any other necessary peripheral circuitry. There is one row select line (SG) for each row of local bit line pillars in the x-direction and one select device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL).

In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines. In one embodiment, the NVM material includes hafnium oxide, the word lines comprise TiN, and the bit lines comprise N+ silicon.

There also may be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element never conducts a significant amount of current. Similarly, in other embodiments, the non-conducting NVM material may be left in place between adjacent local bit lines if the operating voltages between the adjacent LBLs remain below the programming threshold.

An outline of a process for fabricating the structure of FIG. 3 is as follows:

1. The support circuitry, including the select devices Q, global bit lines GBL, row select lines SG and other circuits peripheral to the array, is formed in the silicon substrate in a conventional fashion and the top surface of this circuitry is planarized, such as by etching with use of a layer of etch stop material placed over the circuitry.
2. Alternating layers of dielectric (insulator) and metal are formed as sheets on top of each other and over at least the area of the substrate in which the select devices Q are formed. In the example of FIG. 3, four such sheets are formed.
3. These sheets are then etched (isolated) by using a mask formed over the top of them that has slits elongated in the x-direction and spaced apart in the y-direction. All of the material is removed down to the etch stop to form the trenches shown in FIG. 3 in which the local bit line (LBL) pillars and NVM material is later formed. Contact holes are also etched through the etch stop material layer at the bottom of the trenches to allow access to the drains of the select devices Q at the positions of the subsequently formed pillars. The formation of the trenches also defines the width in the y-direction of the word lines (WL).
4. NVM material is deposited in thin layers along the sidewalls of these trenches and across the structure above the trenches. This leaves the NVM material along the opposing sidewalls of each of the trenches and in contact with the word line (WL) surfaces that are exposed into the trenches.
5. Doped poly silicon (or suitable metallic electrode material) is then deposited in these trenches in order to make contact with the NVM material. The deposited material is patterned using a mask with slits in the y-direction. Removal of the deposited material by etching through this mask leaves the local bit line (LBL) pillars. The NVM material in the x-direction may also be removed between pillars. The space between pillars in the x-direction is then filled with a dielectric material and planarized back to the top of the structure.

A significant advantage of the configuration of FIG. 3 is that only one etching operation through a single mask is required to form the trenches through all the layers of material of the planes at one time. However, process limitations may limit the number of planes that can be etched together in this manner. If the total thickness of all the layers is too great, the trench may need to be formed in sequential steps. A first number of layers are etched and, after a second number of layers have been formed on top of the first number of trenched layers, the top layers are subjected to a second etching step to form trenches in them that are aligned with the trenches in the bottom layers. This sequence may be repeated even more times for an implementation having a very large number of layers.

In some memory arrays, a separate word line driver is used to set the voltage level of each word line in the memory array. In other memory arrays, to minimize the number of required word line drivers, each word line driver may be connected to a group of multiple word lines connected together, where a memory system will have many of such groups.

In one example implementation, 16 (or another number) of word lines are connected together, and the connected group of word lines are connected to a single word line driver. In one example, the 16 word lines are connected together to form a comb shape. However, other shapes can also be used. Using one word line driver to drive 16 (or a different number) of word lines in a single comb (or other shaped structure) reduces the number of word line drivers. As a result, the word line drivers can fit underneath the memory array.

The use of the vertically oriented select devices described above also provides more room underneath the memory array (e.g., in the substrate) to implement word line drivers. Additionally, using one or more word line drivers to drive multiple word lines reduces the number of wires needed from the word line drivers to the word lines, thereby saving room, simplifying routing, reducing power and reducing the chance of a fault. Additionally, because the word lines and bit lines are now shorter, there is a smaller time constant than in previous designs. Because there is a smaller time constant, the lines settle quicker and there is no significant transient effect that causes a disturb for unselected memory cells.

FIG. 4A is a simplified diagram of a memory cell 400 coupled in series with a select transistor 402. Memory cell 400 includes a NVM material layer disposed between a top electrode TEL and a bottom electrode BEL. The structure of memory cell 400 is often referred to as metal-insulator-metal (MIM) structure. One or more material layers may be used to form each of the NVM material layer, top electrode TEL and bottom electrode BEL.

Top electrode TEL is coupled to a first conductor (e.g., a word line), and bottom electrode BEL is coupled to a first terminal (e.g., a drain or a source terminal) of select transistor 402. A second terminal (e.g., a gate terminal) of select transistor 402 is coupled to a second conductor (e.g., a select line), and a third terminal (e.g., a source or drain terminal) of select transistor 401 is coupled to a third conductor (e.g., a bit line).

Top electrode TEL may be between about 50 angstroms and about 500 angstroms thick, although other thicknesses may be used. Top electrode TEL may include one or more of tungsten, titanium nitride, tantalum nitride, platinum, highly doped semiconductor material (e.g., highly doped polysilicon), or other conductive material. Top electrode TEL may be a single layer of one material, or multiple layers of different materials.

Bottom electrode BEL may be between about 50 angstroms and about 500 angstroms thick, although other thicknesses may be used. Bottom electrode BEL may include one or more of tungsten, titanium nitride, tantalum nitride, platinum, highly doped semiconductor material (e.g., highly doped polysilicon), or other conductive material. Bottom electrode TEL may be a single layer of one material, or multiple layers of different materials.

The NVM material layer may be between about 20 angstroms and about 200 angstroms thick, although other thicknesses may be used. The NVM material layer may include one or more of $TiO_x$, $HfO_x$, $ZrO_x$, $WO_x$, $NiO_x$, $CoO_x$, $CoalO_x$, $MnO_x$, $ZnMn_2O_4$, $ZnO_x$, $TaO_x$, $NbO_x$, $HfSiO_x$, $HfAlO_x$. Other NVM materials may be used. The NV material layer may be a single layer of one material, or multiple layers of different materials.

Upon application of sufficient voltage, current, or other stimulus between the word line and bit line, and with a sufficient voltage Vg applied to the select line, the NVM material layer switches to a stable low-resistance state. This resistance-switching is reversible such that subsequent application of an appropriate voltage, current, or other stimulus can serve to return the reversible resistance-switching material to a stable high-resistance state.

One theory to explain the resistance-switching mechanism is that application of a voltage to the memory forms one or more conductive filaments in the NVM material layer. The conductive filaments lower the resistance of the memory cell. Application of another voltage may rupture the conductive filaments, thereby increasing the resistance of the memory cell. Application of still another voltage may repair the rupture in the conductive filaments, thereby decreasing the resistance of the memory cell once again.

Another theory to explain the resistance-switching mechanism is that application of a voltage to the memory causes oxygen vacancies to distribute along an interface that controls the conductivity of the MIM structure. The interfacial switching mechanism may occur at one or both of the interfaces between the NVM material layer and the top electrode TEL and bottom electrode BEL. The interfacial resistance-switching mechanism tends to occur if switching currents are limited to about less than a few tens of microamps, whereas the filamentary switching mechanism tends to occur at if switching currents are greater than about 5-30 microamps.

FIG. 4B illustrates a simplified circuit diagram showing an interfacial switching model of memory cell 400 of FIG. 4A. In particular, memory cell 400 includes a first interface switch 404 and a second interface switch 406. First interface switch 404 represents an interface switch at an interface between top electrode TEL and the NVM material layer. Second interface switch 406 represents an interface switch at an interface between bottom electrode BEL and the NVM material layer.

Bipolar switching is one mode of switching the resistance of the interfacial switches. In bipolar switching, the interfacial switches may be SET and RESET by applying voltages of both polarities to a memory cell. In FIG. 4B, applying a voltage at node A higher than a voltage at node C is referred to herein as Forward bias, and applying a voltage at node C higher than a voltage at node A is referred to herein as Reverse bias. In addition, by controlling the voltage Vg applied to the gate terminal of transistor 402, the switching current may be limited to a desired compliance current limit.

FIGS. 5A-5D illustrate example interfacial switching characteristics of a reversible resistance-switching memory cell, such as memory cell 400 of FIGS. 4A and 4B. In particular, FIGS. 5A-5D show that memory cell 400 exhibits Forward Set and Forward Reset interfacial switching characteristics, and Reverse Set and Reverse Reset switching interfacial characteristics.

Figure 5A:
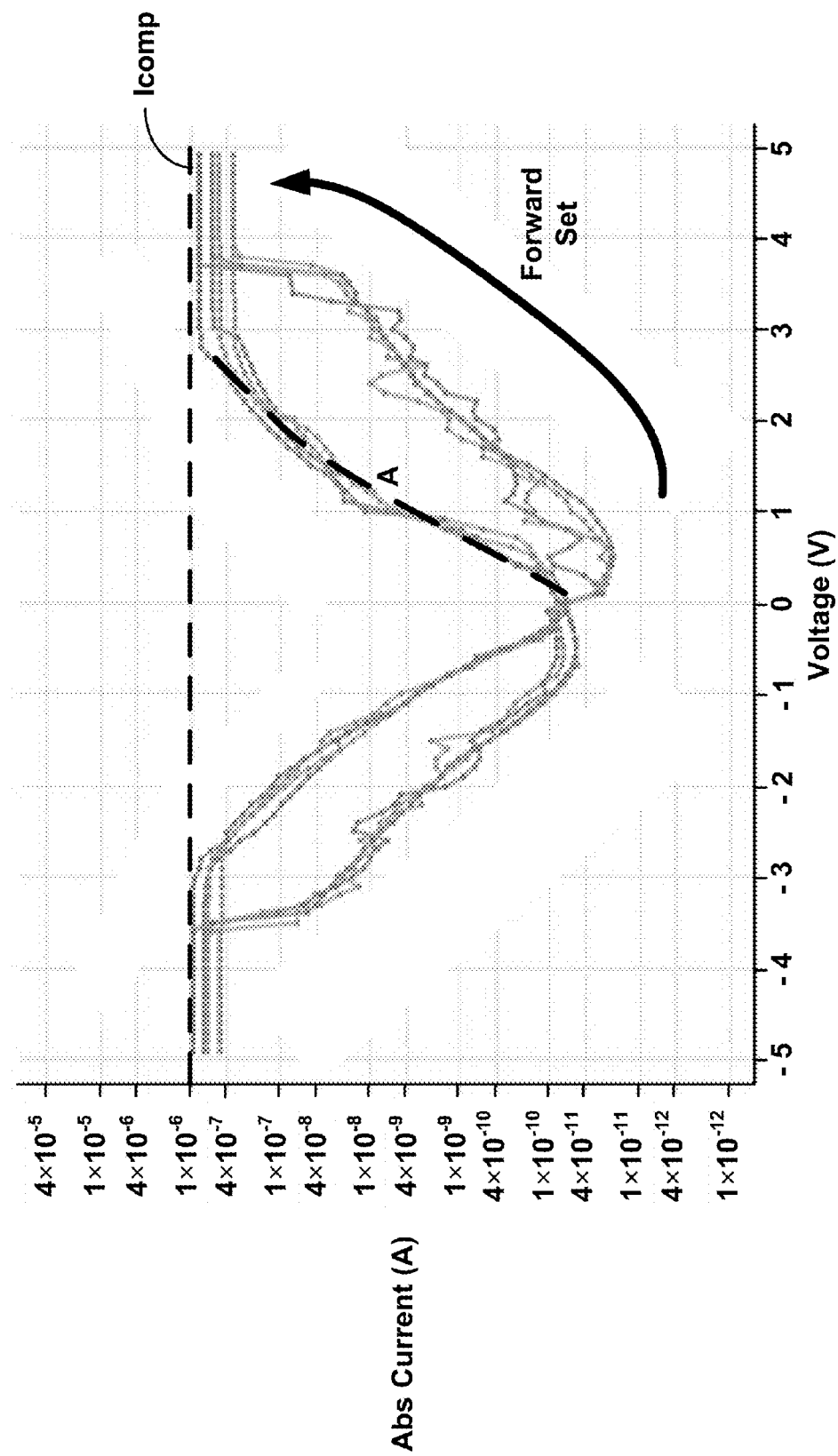
FIGS. 5A-5D illustrate example interfacial switching characteristics of a reversible resistance-switching memory cell.

For example, if a Forward SET voltage (e.g., +4V) is applied to memory cell 400, the switching elements is Forward SET as shown in FIG. 5A, with the low resistance state in Forward bias shown by dashed curve A, and with the high resistance state in Reverse bias READ (−1V), which is "state 1 or 2" in FIG. 7.

Figure 5B:
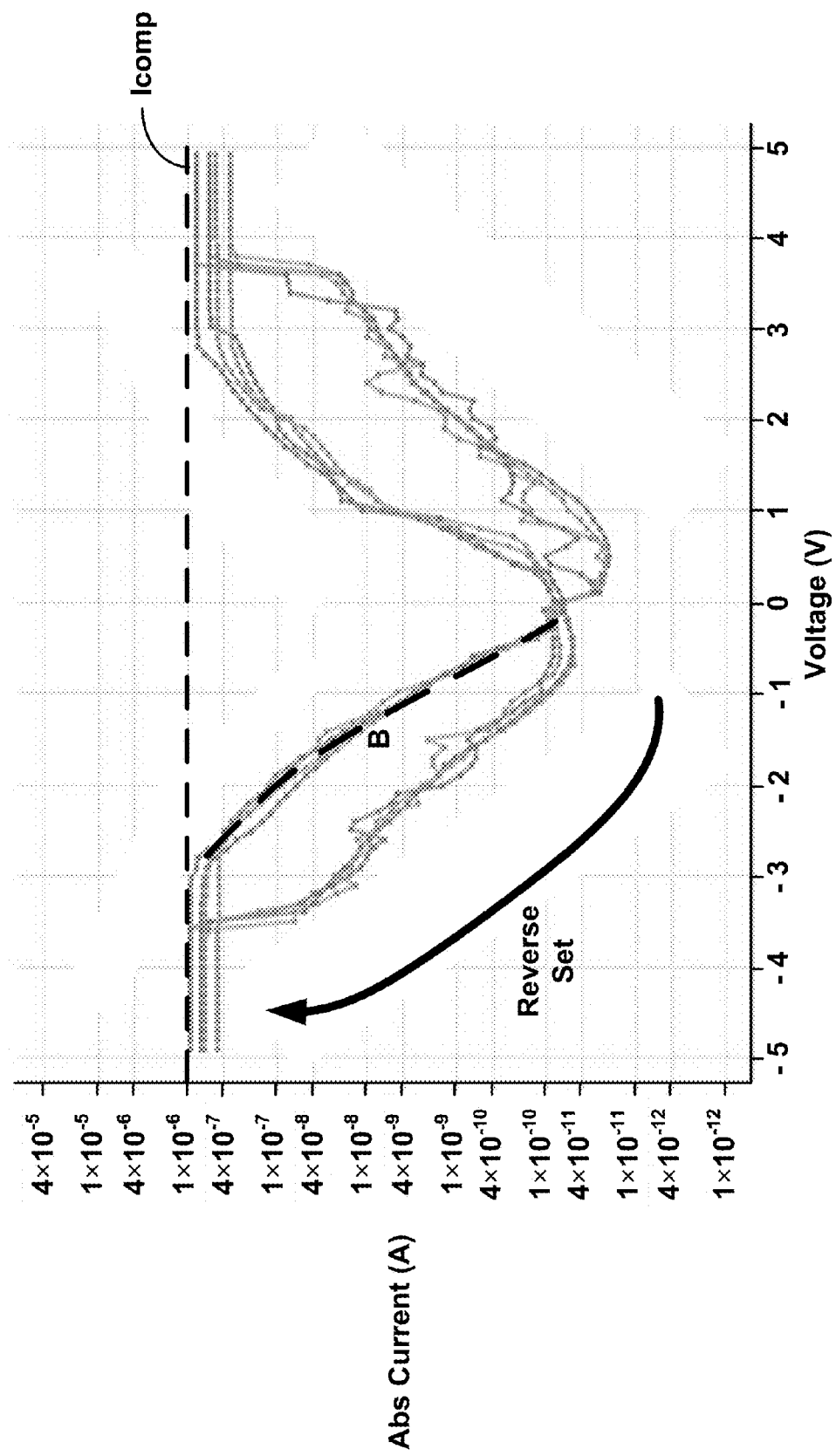

If a Reverse SET voltage (e.g., −4V) is applied to memory cell 400, the switching elements is Reverse SET as shown in FIG. 5B, with the low resistance state in Reverse bias shown by dashed curve B, and with the high resistance state in Forward bias READ (+1V), which is "state 3 or 4" in FIG. 7.

Figure 5C:
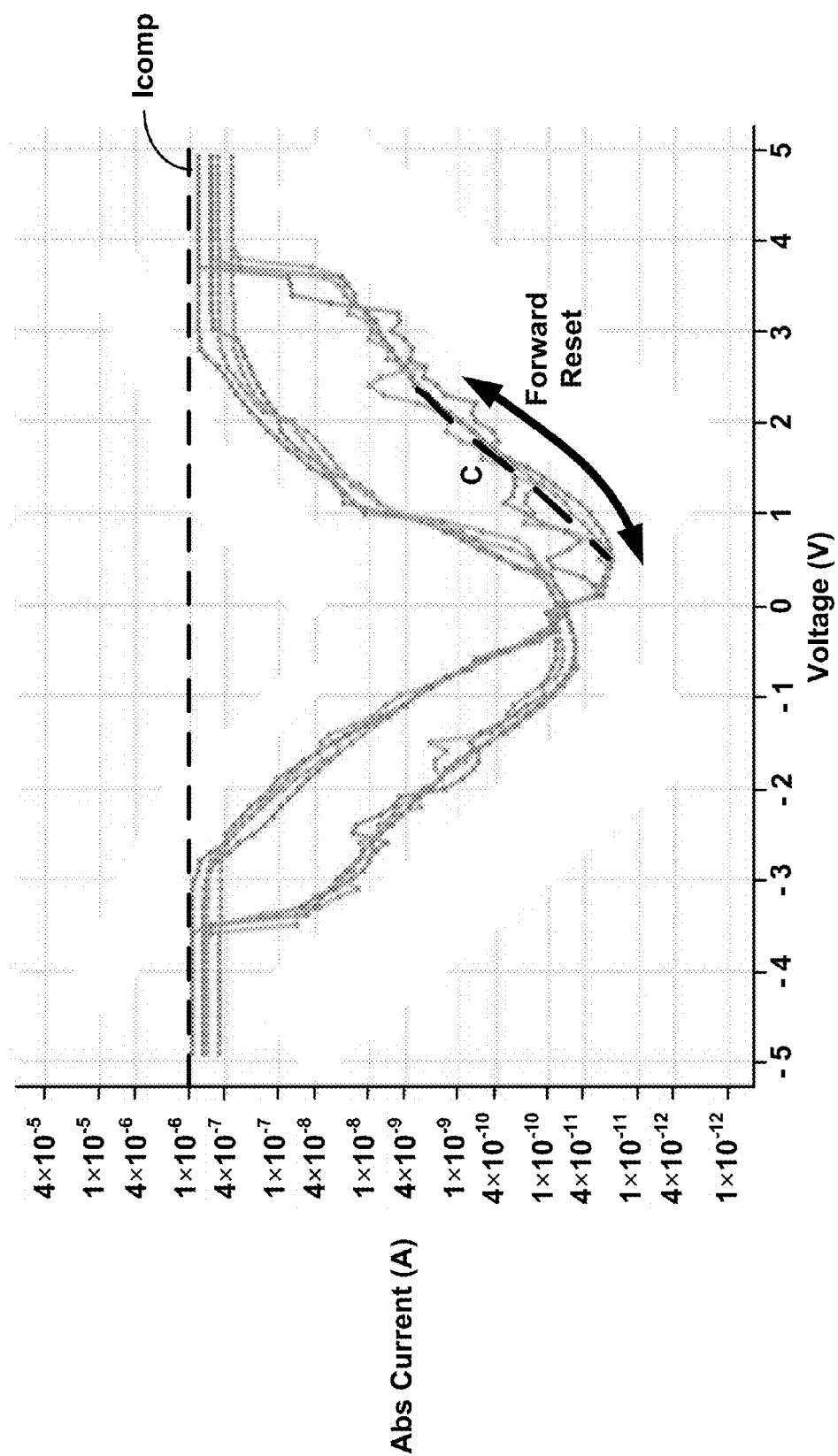

If a Forward RESET voltage (e.g., +2.5V) is applied to memory cell 400, the switching element is Forward RESET as shown in FIG. 5C, with the high resistance state in Forward/Reverse bias READ (+1V/−1V) shown by dashed curve C, which is "state 5" in FIG. 7.

Figure 5D:
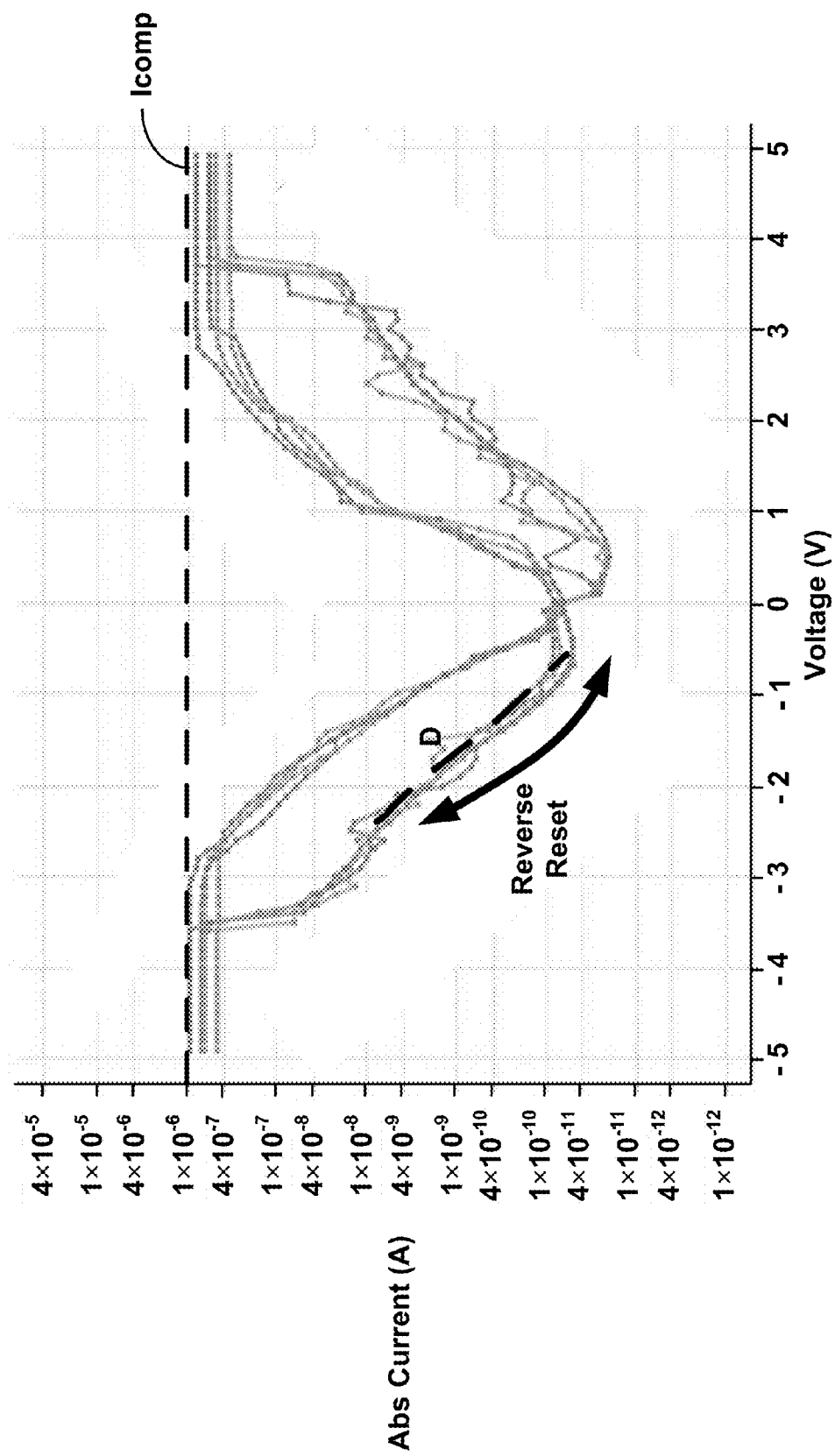

If a Reverse RESET voltage (e.g., −2.5V) is applied to memory cell 400, the switching element is Reverse RESET as shown in FIG. 5D, with the high resistance state in Forward/Reverse bias READ (+1V/−1V) shown by dashed curve D, which is "state 5" in FIG. 7. Note that in FIGS. 5A-5D, gate voltage Vg of transistor 402 is set to achieve a compliance current limit Icomp of about 1 µA. Other forward and reverse SET and RESET voltages may be used, and other compliance current limits may be used.

Bipolar read operations may be performed on memory cell 400 of FIGS. 4A and 4B. A bipolar read is an operation in which read operations in forward bias and in reverse bias are performed. For example, a forward read voltage (e.g., +1V) may be applied to memory cell 400 to perform a forward read, and a reverse read voltage (e.g., −1V) may be applied to memory cell 400 to perform a reverse read. Table 1, below summarizes example results of bipolar read operations on memory cell 400:

TABLE 1

| Forward Set | Ifwd > Irev |
|---|---|
| Forward Reset | Ifwd, Irev both very small |
| Reverse Set | Irev > Ifwd |
| Reverse Reset | Ifwd, Irev both very small | where Ifwd is a forward read current and Irev is a reverse read current of memory cell 400. Thus, when memory cell 400 is forward set, forward read current Ifwd is greater than reverse read current Irev, and when memory cell 400 is reverse set, reverse read current Irev is greater than forward read current Ifwd. When memory cell 400 is forward reset and reverse reset, forward read current Ifwd and reverse read current Irev are both very small (e.g., less than about 10 nA)

In an embodiment, reversible resistance-switching memory cells may be configured to exhibit interfacial switching behavior and provide four or more resistance states to store two or more bits of data. In an embodiment, reversible resistance-switching memory cells may be forward set using first and second current compliance limits to provide first and second memory states, and may be reverse set using third and fourth current compliance limits to provide third and fourth memory states. In addition, reversible resistance-switching memory cells may be forward reset or reverse reset to provide a fifth memory state.

Figure 6B:
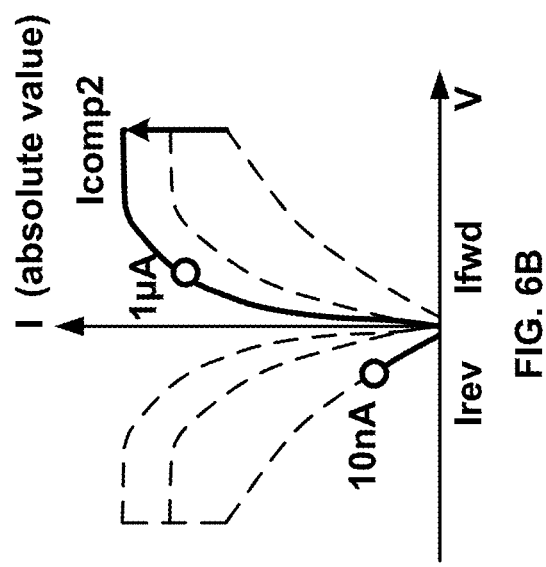
Figure 6A:
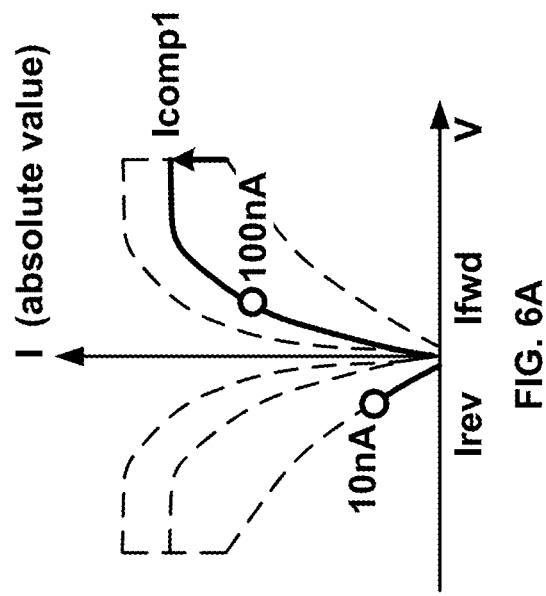
Figure 6E:
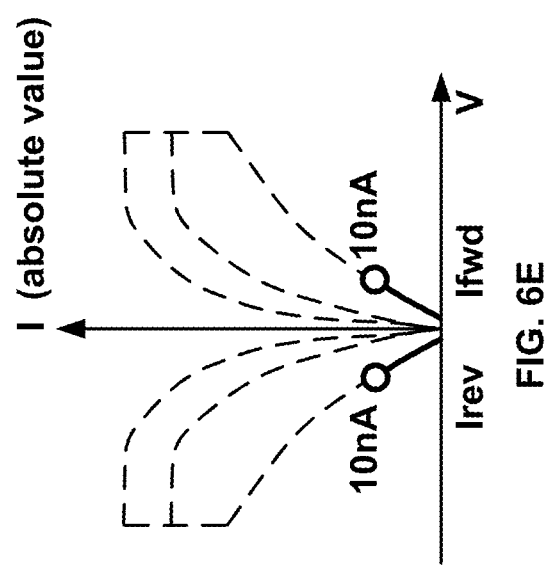

FIGS. 6A-6E illustrate an example embodiment of a reversible resistance-switching memory cell (such a memory cell 400) that has five different memory states. In particular, FIGS. 6A-6B illustrate diagrams showing example bipolar read currents for two different forward set memory states, FIGS. 6C-6D illustrate diagrams showing example bipolar read currents for two different reverse set memory states, and FIG. 6E illustrates a diagram showing example bipolar read currents for a forward or reverse reset memory state.

In particular, FIG. 6A illustrates bipolar read currents of Ifwd=100 nA and Irev=10 nA for a reversible resistance-switching memory cell forward set with a first compliance current Icomp1 (e.g., Icomp1=1 µA). Other values of first compliance current Icomp1 may be used, and other bipolar read currents may be used.

FIG. 6B illustrates bipolar read currents of Ifwd=1 µA and Irev=10 nA for a reversible resistance-switching memory cell forward set with a second compliance current Icomp2 (e.g., Icomp2=10 µA). Other values of second compliance current Icomp2 may be used, and other bipolar read currents may be used.

FIG. 6C illustrates bipolar read currents of Ifwd=10 nA and Irev=100 nA for a reversible resistance-switching memory cell reverse set with a third compliance current Icomp3 (e.g., Icomp3=−1 µA). Other values of third compliance current Icomp3 may be used, and other bipolar read currents may be used.

FIG. 6D illustrates bipolar read currents of Ifwd=10 nA and Irev=1 µA for a reversible resistance-switching memory cell reverse set with a fourth compliance current Icomp4 (e.g., Icomp4=−10 µA). Other values of fourth compliance current Icomp4 may be used, and other bipolar read currents may be used.

FIG. 6E illustrates bipolar read currents of Ifwd=10 nA and Irev=10 nA for a reversible resistance-switching memory cell forward reset (or reverse reset). Other bipolar read currents may be used.

FIG. 7 summarizes the forward read and reverse read currents for each of the five memory states depicted in FIGS. 6A-6E. Persons of ordinary skill in the art will understand that more than five states may be used, and that other bipolar read current values may be used.

Figure 8A:
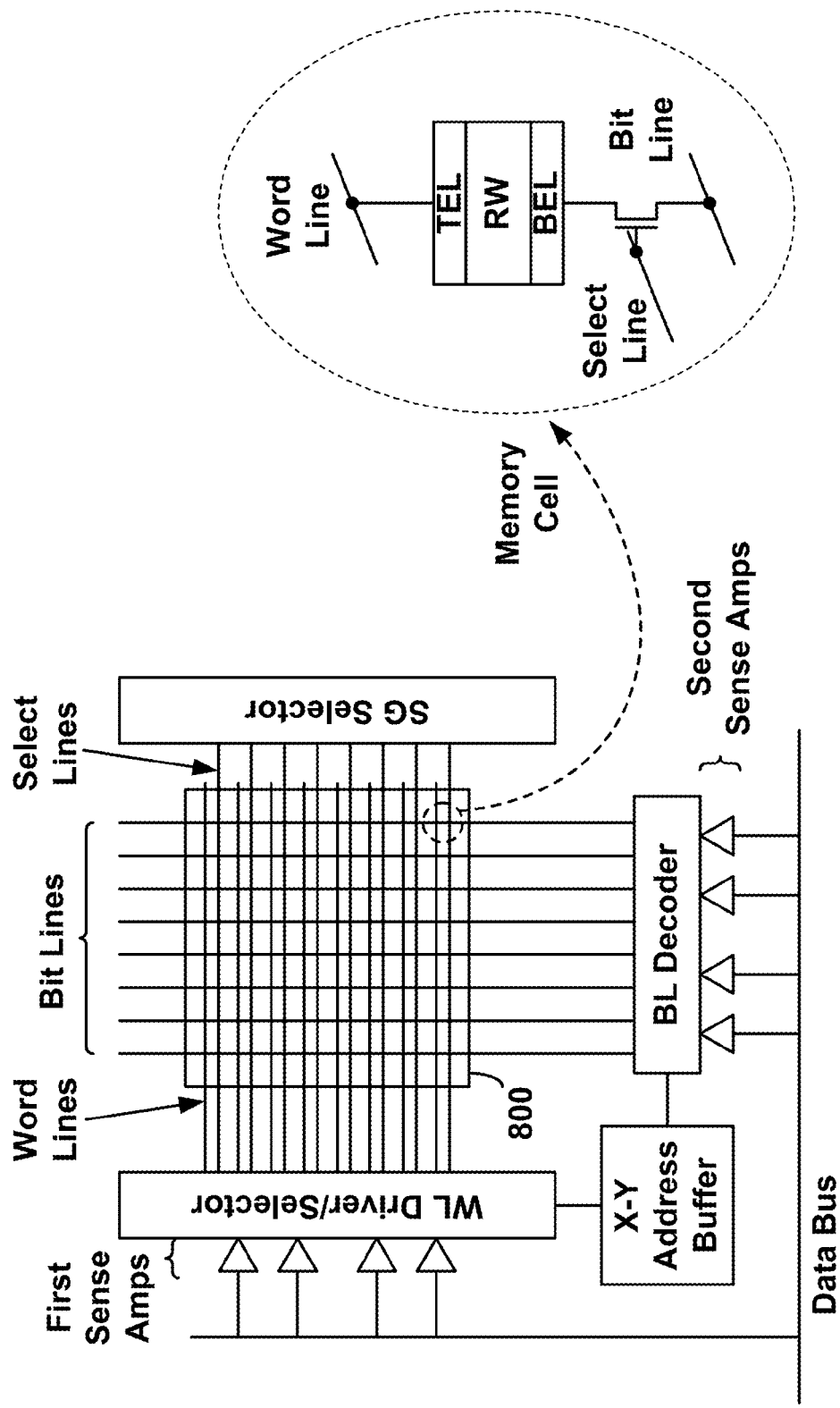
FIGS. 8A and 8B are
Figure 8B:
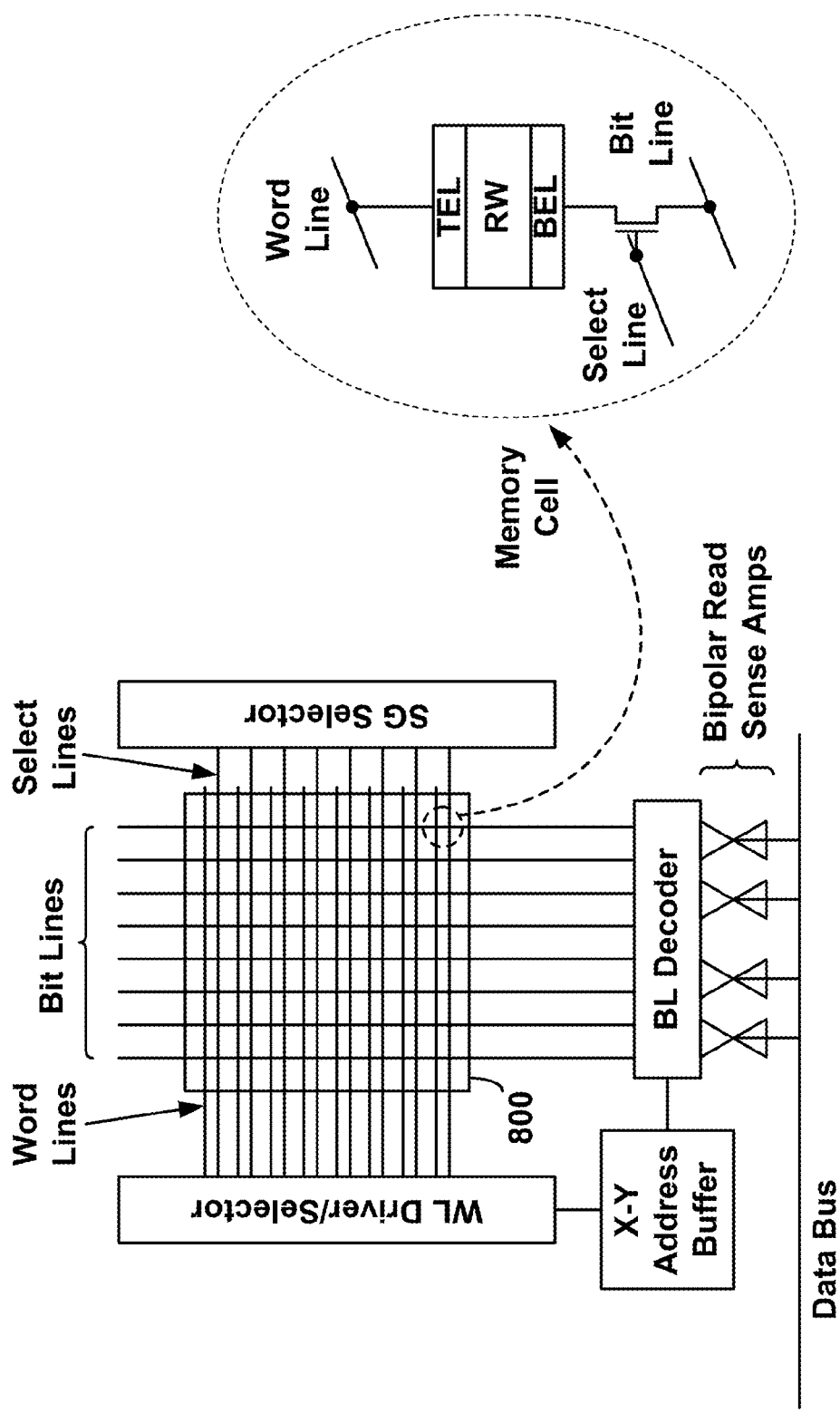

FIGS. 8A and 8B illustrate block diagrams of example circuits that may be used to perform bipolar reads. As described above, to perform a bipolar read operation, a sense amplifier is used to measure a forward read current Ifwd in forward bias, and a sense amplifier is used to measure a reverse read current Irev in reverse bias. In FIG. 8A, first sense amplifiers coupled to word line of a memory array 800 are used to measure forward read current Ifwd in forward bias, and second sense amplifiers coupled to bit line of memory array 800 are used to measure reverse read current Irev in reverse bias. In FIG. 8B, in contrast, bipolar sense amplifiers coupled to bit lines of memory array 800 are used to measure forward read current Ifwd in forward bias and measure reverse read current Irev in reverse bias.

Figure 9:
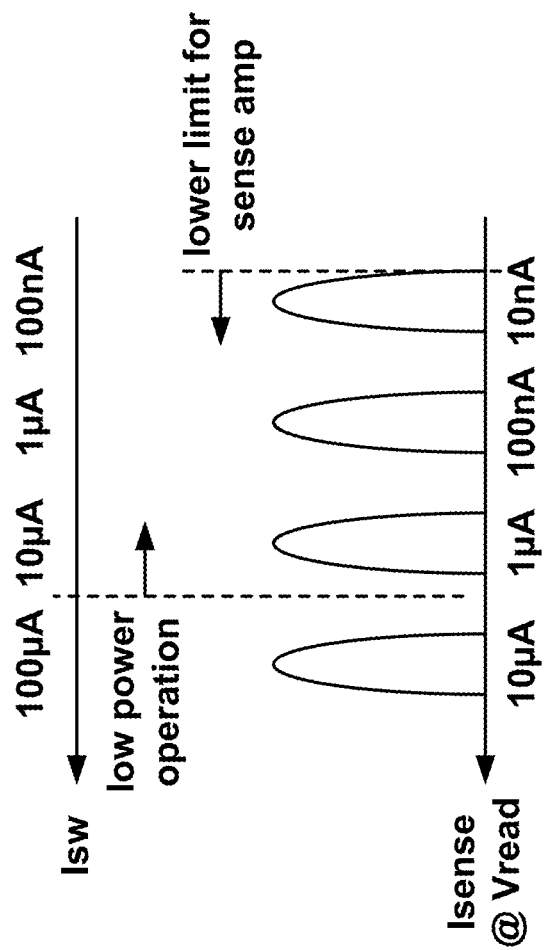
FIG. 9 illustrates an example relationship between a switching operation current Isw and a read current Isense.

FIG. 9 illustrates an example relationship between a switching operation current Isw and a read current Isense. In an embodiment, switching operation current Isw is about ten times greater than read current Isense. Other switching operation currents may be used, and may be less than 100 uA due to lowering power consumption and designing small die size. In the illustrated example, a maximum value of read current Isense is about 10 uA. Other maximum read currents may be used. Because of performance limits of a conventional sense amplifiers, a minimum value of read current Isense is about 10 nA, although other minimum read current values may be used.

FIG. 10 illustrates example programming parameters for programming a reversible resistance-switching memory cell, such as memory cell 400 of FIGS. 4A-4B, into any of five different memory states. Memory cell 400 may be programmed by a memory controller, such as memory controller 206 of FIG. 2. To program memory cell 400 to a first memory state, program pulses Vpgm of about +4V are applied to the memory cell while limiting current through memory cell 400 to a compliance current Icomp of about +1 μA by applying a voltage Vg of about 0.8V to the gate of transistor 402. One or more program pulses may be applied, and a bipolar read operation may be performed after each pulse until a forward read current Ifwd of about +100 nA and a reverse read current Irev of about −10 nA are achieved.

To program memory cell 400 to a second memory state, program pulses Vpgm of about +4V are applied to the memory cell while limiting current through memory cell 400 to a compliance current Icomp of about +10 μA by applying a voltage Vg of about 1.2V to the gate of transistor 402. One or more program pulses may be applied, and a bipolar read operation may be performed after each pulse until a forward read current Ifwd of about +1 μA and a reverse read current Irev of about −10 nA are achieved.

To program memory cell 400 to a third memory state, program pulses Vpgm of about −4V are applied to the memory cell while limiting current through memory cell 400 to a compliance current Icomp of about −1 μA by applying a voltage Vg of about 0.8V to the gate of transistor 402. One or more program pulses may be applied, and a bipolar read operation may be performed after each pulse until a forward read current Ifwd of about +10 nA and a reverse read current Irev of about −100 nA are achieved.

To program memory cell 400 to a fourth memory state, program pulses Vpgm of about −4V are applied to the memory cell while limiting current through memory cell 400 to a compliance current Icomp of about −10 μA by applying a voltage Vg of about 1.2V to the gate of transistor 402. One or more program pulses may be applied, and a bipolar read operation may be performed after each pulse until a forward read current Ifwd of about +10 nA and a reverse read current Irev of about −1 μA are achieved.

To program memory cell 400 to a fifth memory state, program pulses Vpgm of about +/−2.5V are applied to the memory cell while limiting current through memory cell 400 to a compliance current Icomp of about +/−10 μA by applying a voltage Vg of about 1.2V to the gate of transistor 402. One or more program pulses may be applied, and a bipolar read operation may be performed after each pulse until a forward read current Ifwd of about +10 nA and a reverse read current Irev of about −10 nA are achieved.

Persons of ordinary skill in the art will understand that other programming pulse magnitudes, compliance currents, gate voltages, and forward and reverse read currents may be used. In addition, although the same program pulse Vpgm magnitude may be used for the first and second memory states, a first program pulse Vpgm1 magnitude may be used for the first memory state and a second program pulse Vpgm2 magnitude may be used for the second memory state. Likewise, although the same program pulse Vpgm magnitude may be used for the third and fourth memory states, a third program pulse Vpgm3 magnitude may be used for the third memory state and a fourth program pulse Vpgm4 magnitude may be used for the fourth memory state.

Any combination of four of the five memory states may be used to store two bits of data in memory cell 400. For example, the first through fourth memory states may be used to store two bits of data. Alternatively, the first through third memory states plus the fifth memory state may be used to store two bits of data, and so on.

One embodiment of the disclosed technology includes a method for operating a reversible resistance-switching memory cell. The method includes programming the reversible resistance-switching memory cell to three or more memory states while limiting the current through the memory cell to less than between about 0.1 microamp and about 30 microamps.

One embodiment of the disclosed technology includes a non-volatile storage system that includes a reversible resistance-switching memory cell and a controller coupled to the reversible resistance-switching memory cell. The controller is configured to program the reversible resistance-switching memory cell to three or more memory states while limiting the current through the memory cell to less than between about 0.1 microamp and about 30 microamps.

One embodiment of the disclosed technology includes a three-dimensional memory including a reversible resistance-switching memory cell and a controller means coupled to the reversible resistance-switching memory cell. The controller means is configured to program the reversible resistance-switching memory cell to three or more memory states while limiting the current through the memory cell to less than between about 0.1 microamp and about 30 microamps.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method for operating a reversible resistance-switching memory cell, the method comprising:
   programming the reversible resistance-switching memory cell to three or more memory states while limiting the current through the memory cell to less than between about 0.1 microamp and about 30 microamps.

2. The method of claim 1, wherein the reversible resistance-switching memory cell comprises a non-volatile material layer comprising one or more of $TiO_x$, $HfO_x$, $ZrO_x$, $WO_x$, $NiO_x$, $CoO_x$, $CoalO_x$, $MnO_x$, $ZnMn_2O_4$, $ZnO_x$, $TaO_x$, $NbO_x$, $HfSiO_x$, $HfAlO_x$.

3. The method of claim 1, wherein the reversible resistance-switching memory cell comprises a metal-insulator-metal memory cell.

4. The method of claim 1, wherein the reversible resistance-switching memory cell comprises a non-volatile material layer disposed between a top electrode and a bottom electrode.

5. The method of claim 1, wherein programming the reversible resistance-switching memory cell comprises applying programming pulses to the reversible resistance-switching memory cell while limiting a current through the reversible resistance-switching memory cell.

6. The method of claim 1, wherein programming the reversible resistance-switching memory cell comprises:

programming the reversible resistance-switching memory cell to a first memory state by applying first programming pulses to the reversible resistance-switching memory cell while limiting a current through the reversible resistance-switching memory cell to a first compliance current;

programming the reversible resistance-switching memory cell to a second memory state by applying second programming pulses to the reversible resistance-switching memory cell while limiting the current through the reversible resistance-switching memory cell to a second compliance current;

programming the reversible resistance-switching memory cell to a third memory state by applying third programming pulses to the reversible resistance-switching memory cell while limiting the current through the reversible resistance-switching memory cell to a third compliance current; and programming the reversible resistance-switching memory cell to a fourth memory state by applying fourth programming pulses to the reversible resistance-switching memory cell while limiting the current through the reversible resistance-switching memory cell to a fourth compliance current.

7. The method of claim 1, wherein the reversible resistance-switching memory cell stores two bits of data.

8. The method of claim 1, wherein the reversible resistance-switching memory cell may be programmed into any of five different memory states, and the reversible resistance-switching memory cell may be used to store two bits of data by using any four of the five different memory states.

* * * * *